(12) United States Patent
Kuramata et al.

(10) Patent No.: US 11,264,241 B2
(45) Date of Patent: Mar. 1, 2022

(54) SEMICONDUCTOR SUBSTRATE, SEMICONDUCTOR ELEMENT AND METHOD FOR PRODUCING SEMICONDUCTOR SUBSTRATE

(71) Applicants: TAMURA CORPORATION, Tokyo (JP); SICOXS Corporation, Tokyo (JP); National Institute of Information and Communications Technology, Tokyo (JP)

(72) Inventors: Akito Kuramata, Sayama (JP); Shinya Watanabe, Sayama (JP); Kohei Sasaki, Sayama (JP); Kuniaki Yagi, Tokyo (JP); Naoki Hatta, Tokyo (JP); Masataka Higashiwaki, Tokyo (JP); Keita Konishi, Tokyo (JP)

(73) Assignees: TAMURA CORPORATION, Tokyo (JP); SICOXS Corporation, Tokyo (JP); National Institute of Information and Commnications Technology, Tokyo (JP)

( * ) Notice: Subject to any disclaimer, the term of this patent is extended or adjusted under 35 U.S.C. 154(b) by 0 days.

(21) Appl. No.: 16/630,087

(22) PCT Filed: Jul. 9, 2018

(86) PCT No.: PCT/JP2018/025900
§ 371 (c)(1),
(2) Date: Jan. 10, 2020

(87) PCT Pub. No.: WO2019/013170
PCT Pub. Date: Jan. 17, 2019

(65) Prior Publication Data
US 2020/0168460 A1 May 28, 2020

(30) Foreign Application Priority Data
Jul. 10, 2017 (JP) .............................. JP2017-135017

(51) Int. Cl.
*H01L 21/18* (2006.01)
*H01L 21/02* (2006.01)
(Continued)

(52) U.S. Cl.
CPC ...... *H01L 21/187* (2013.01); *H01L 21/02529* (2013.01); *H01L 21/02565* (2013.01);
(Continued)

(58) Field of Classification Search
None
See application file for complete search history.

(56) References Cited

U.S. PATENT DOCUMENTS 9,461,124 B2 10/2016 Sasaki et al.
9,761,479 B2 9/2017 Imaoka et al.
(Continued)

FOREIGN PATENT DOCUMENTS

CN 105474354 A 4/2016
EP 2 765 610 A1 8/2014
(Continued)

OTHER PUBLICATIONS

International Search Report dated Oct. 2, 2018 issued in PCT/JP2018/025900.
(Continued)

*Primary Examiner* — Alexander G Ghyka
(74) *Attorney, Agent, or Firm* — Scully, Scott, Murphy & Presser, P.C.

(57) ABSTRACT

A semiconductor substrate includes a single crystal $Ga_2O_3$-based substrate and a polycrystalline substrate that are bonded to each other. A thickness of the single crystal $Ga_2O_3$-based substrate is smaller than a thickness of the polycrystalline substrate, and a fracture toughness value of
(Continued)

the polycrystalline substrate is higher than a fracture toughness value of the single crystal $Ga_2O_3$-based substrate.

7 Claims, 7 Drawing Sheets

(51) Int. Cl.
| | |
|---|---|
| *H01L 21/78* | (2006.01) |
| *H01L 29/04* | (2006.01) |
| *H01L 29/16* | (2006.01) |
| *H01L 29/24* | (2006.01) |
| *H01L 29/267* | (2006.01) |
| *H01L 29/36* | (2006.01) |
| *H01L 29/78* | (2006.01) |
| *H01L 29/872* | (2006.01) |

(52) U.S. Cl.
CPC .. *H01L 21/02592* (2013.01); *H01L 21/02667* (2013.01); *H01L 21/7813* (2013.01); *H01L 29/045* (2013.01); *H01L 29/1608* (2013.01); *H01L 29/24* (2013.01); *H01L 29/267* (2013.01); *H01L 29/36* (2013.01); *H01L 29/7813* (2013.01); *H01L 29/872* (2013.01)

(56) References Cited

U.S. PATENT DOCUMENTS

| | | | |
|---|---|---|---|
| 10,230,007 | B2 | 3/2019 | Sasaki et al. |
| 2010/0233866 | A1 | 9/2010 | Akiyama et al. |
| 2011/0111574 | A1 | 5/2011 | Akiyama et al. |
| 2011/0244654 | A1 | 10/2011 | Akiyama et al. |
| 2014/0217405 | A1* | 8/2014 | Sasaki .............. H01L 29/66712 257/43 |
| 2016/0204023 | A1 | 7/2016 | Imaoka et al. |
| 2016/0365418 | A1 | 12/2016 | Sasaki et al. |
| 2017/0213918 | A1 | 7/2017 | Sasaki et al. |
| 2018/0047630 | A1 | 2/2018 | Kato et al. |
| 2018/0350967 | A1 | 12/2018 | Sasaki et al. |

FOREIGN PATENT DOCUMENTS

| | | |
|---|---|---|
| EP | 3 018 696 A1 | 5/2016 |
| JP | 2007-220899 A | 8/2007 |
| JP | 2015-15401 A | 1/2015 |
| JP | 2015-018881 A | 1/2015 |
| JP | 2016-15503 A | 1/2016 |
| JP | 2016-031953 A | 3/2016 |
| JP | 2016-197737 A | 11/2016 |
| JP | 6061251 B2 | 1/2017 |
| WO | 2016-140229 A1 | 9/2016 |
| WO | 2016/140229 A1 | 9/2016 |

OTHER PUBLICATIONS

Translation of International Preliminary Report on Patentability dated Jan. 23, 2020 issued in PCT/JP2018/025900.
Notification of First Office Action dated Jan. 4, 2021 received from the China National Intellectual Property Administration in related application CN 201880046032.1, together with English language translation.
European Extended Supplementary Search Report dated Jan. 21, 2021 received in European Application No. 18 83 1693.9.
Japanese Office Action dated Aug. 24, 2024 received in Japanese Application No. 2017-135017, together with an English-language translation.

* cited by examiner

SEMICONDUCTOR SUBSTRATE, SEMICONDUCTOR ELEMENT AND METHOD FOR PRODUCING SEMICONDUCTOR SUBSTRATE

TECHNICAL FIELD

The invention relates to a semiconductor substrate, a semiconductor element, and a method for producing a semiconductor substrate.

BACKGROUND ART

Surface activated bonding, which is a method for bonding a single crystal substrate to a support substrate, is known (see, e.g., Patent Literature 1). In the surface activated bonding, the respective bonding surfaces of two substrates are damaged by Ar (argon) ion bombardment and are then brought into contact with each other, thereby bonding the two substrates. In the method of Patent Literature 1, a heat treatment step is further added to the normal surface-activated bonding process, and heat treatment is performed after bonding the surfaces of the two substrates. Due to the heat treatment, the bonding surfaces which turned into amorphous by Ar ion bombardment are recrystallized and stronger bonding is obtained between the two substrates due to covalent bonding.

Also, a Schottky barrier diode is known, which includes an epitaxial layer formed of a $Ga_2O_3$-based crystal and a highly thermally conductive substrate formed of a material having a higher thermal conductivity than the $Ga_2O_3$-based crystal and bonded to the epitaxial layer by the surface activated bonding (see, e.g., Patent Literature 2).

CITATION LIST

Patent Literatures

Patent Literature 1: Japanese Patent No. 6061251
Patent Literature 2: JP 2016/31953 A

SUMMARY OF INVENTION

Technical Problem $Ga_2O_3$-based single crystal has cleavage planes highly likely to cause cleavage, and thus has a low crack resistance and breaks easily. For this reason, as foundation substrates for growing epitaxial layers formed of a $Ga_2O_3$-based single crystal, there is a demand for substrates with excellent mechanical strength and less likely to break.

It is an object of the invention to provide a semiconductor substrate which includes a layer formed of a $Ga_2O_3$-based single crystal and is excellent in mechanical strength, a semiconductor element including the semiconductor substrate, and a method for producing the semiconductor substrate.

Solution to Problem

To achieve the above-mentioned object, an aspect of the invention provides a semiconductor substrate according to [1] to [8] below, a semiconductor element according to [9] below and a method for producing a semiconductor substrate according to [10] and [11] below.

[1] A semiconductor substrate, comprising a single crystal $Ga_2O_3$-based substrate and a polycrystalline substrate that are bonded to each other, wherein a thickness of the single crystal $Ga_2O_3$-based substrate is smaller than a thickness of the polycrystalline substrate, and a fracture toughness value of the polycrystalline substrate is higher than a fracture toughness value of the single crystal $Ga_2O_3$-based substrate.

[2] The semiconductor substrate according to [1], wherein the fracture toughness value of the polycrystalline substrate is not less than 3 $MPa \cdot m^{1/2}$.

[3] The semiconductor substrate according to [2], wherein the polycrystalline substrate comprises a polycrystalline SiC substrate.

[4] The semiconductor substrate according to any one of [1] to [3], wherein a bonding strength between the single crystal $Ga_2O_3$-based substrate and the polycrystalline substrate is not less than 8.3 MPa.

[5] The semiconductor substrate according to any one of [1] to [4], wherein a ratio of the thickness of the single crystal $Ga_2O_3$-based substrate to the thickness of the polycrystalline substrate is not more than about 20%.

[6] The semiconductor substrate according to any one of [1] to [5], wherein the single crystal $Ga_2O_3$-based substrate has a carrier concentration of not less than $3 \times 10^{18}$ $cm^{-3}$.

[7] The semiconductor substrate according to any one of [1] to [6], wherein the single crystal $Ga_2O_3$-based substrate comprises a principal plane including a [010] axis.

[8] The semiconductor substrate according to [7], wherein the principal plane comprises a (001) plane.

[9] A semiconductor element, comprising the semiconductor substrate according to any one of [1] to [8].

[10] A method for producing a semiconductor substrate, comprising: forming a first amorphous layer by damaging a surface of a single crystal $Ga_2O_3$-based substrate and also forming a second amorphous layer by damaging a surface of a polycrystalline SiC substrate; contacting the first amorphous layer with the second amorphous layer; and bonding the single crystal $Ga_2O_3$-based substrate to the polycrystalline SiC substrate by performing heat treatment of not less than 800° C. on the single crystal $Ga_2O_3$-based substrate and the polycrystalline SiC substrate in the state that the first amorphous layer is in contact with the second amorphous layer.

[11] The method for producing a semiconductor substrate according to [10], wherein a temperature of the heat treatment is not more than 1100° C.

Advantageous Effects of Invention

According to the invention, it is possible to provide a semiconductor substrate which includes a layer formed of a $Ga_2O_3$-based single crystal and is excellent in mechanical strength, a semiconductor element including the semiconductor substrate, and a method for producing the semiconductor substrate.

DESCRIPTION OF EMBODIMENTS

First Embodiment (Structure of a Semiconductor Substrate)

Figure 1:
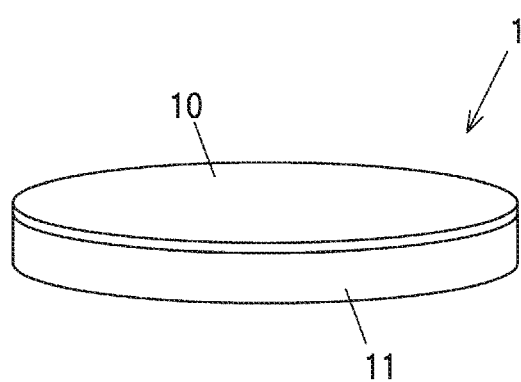
FIG. 1 is a perspective view showing a semiconductor substrate in the first embodiment.

FIG. 1 is a perspective view showing a semiconductor substrate 1 in the first embodiment. The semiconductor substrate 1 is a bonded substrate in which a single crystal $Ga_2O_3$-based substrate 10 is bonded to a polycrystalline substrate 11. The planar shape of the semiconductor substrate 1 is typically a circle as shown in FIG. 1 even though it is not specifically limited.

The single crystal $Ga_2O_3$-based substrate 10 and the polycrystalline substrate 11 of the semiconductor substrate 1 are bonded by the surface activated bonding method (described later), and a predetermined amount (e.g., 1 to 2 atm %) of Ar is contained in the vicinity of the bonded interface between the single crystal $Ga_2O_3$-based substrate 10 and the polycrystalline substrate 11.

In addition, since the single crystal $Ga_2O_3$-based substrate 10 and the polycrystalline substrate 11 are bonded by the surface activated bonding method using a FBA (Fast Atom Beam) gun (described later), the metallic contamination density at the bonded interface is low, e.g., the concentrations of Fe, Ni and Cu are all less than $1 \times 10 \, cm^{-2}$.

The single crystal $Ga_2O_3$-based substrate 10 is a substrate formed of a $Ga_2O_3$-based single crystal and is typically a $Ga_2O_3$ substrate. The single crystal $Ga_2O_3$-based substrate 10 may be undoped (with no intentional doping) or may contain a dopant such as Si or Sn. When the carrier concentration of the single crystal $Ga_2O_3$-based substrate 10 is, e.g., not less than $3 \times 10^{18} \, cm^{-3}$, a barrier at the bonded interface between the single crystal $Ga_2O_3$-based substrate 10 and the polycrystalline substrate 11 disappears, allowing the single crystal $Ga_2O_3$-based substrate 10 to be in ohmic contact with the polycrystalline substrate 11.

The $Ga_2O_3$-based single crystal here means a $Ga_2O_3$ single crystal or is a $Ga_2O_3$ single crystal doped with an element such as Al or In, and may be, e.g., a $(Ga_xAl_yIn_{(1-x-y)})_2O_3$ ($0 < x \leq 1$, $0 \leq y < 1$, $0 < x+y \leq 1$) single crystal which is a $Ga_2O_3$ single crystal doped with Al and In. The band gap is widened by adding Al and is narrowed by adding In. The $Ga_2O_3$-based single crystal constituting the single crystal $Ga_2O_3$-based substrate 10 has, e.g., a β-crystal structure.

The principal plane of the single crystal $Ga_2O_3$-based substrate 10 is preferably a plane including a [010] axis (e.g., a (101) plane, a (−201) plane or a (001) plane). In this case, the single crystal $Ga_2O_3$-based substrate 10 is less likely to break and also has high heat resistance. When having high heat resistance, degradation is less likely to occur in heat treatment at the time of bonding (described later).

Meanwhile, $Ga_2O_3$-based single crystal has high cleavage along a (100) plane and twinning is likely to occur on the (100) plane as a twin plane (a plane of symmetry) during shoulder expansion in crystal growth by the EFG (Edge-defined Film-fed Growth) method. Thus, to cut out as large a piece of the single crystal $Ga_2O_3$-based substrate 10 as possible from the $Ga_2O_3$-based single crystal, it is preferable to grow the $Ga_2O_3$-based single crystal in the b-axis direction so that the (100) plane is parallel to the growth direction of the $Ga_2O_3$-based single crystal. The single crystal $Ga_2O_3$-based substrate 10 having a principal plane containing a [010] axis can be cut out from the $Ga_2O_3$-based single crystal grown in the b-axis direction.

If the semiconductor substrate 1 is required to have particularly high heat resistance, the principal plane of the single crystal $Ga_2O_3$-based substrate 10 is preferably a (001) plane.

The polycrystalline substrate 11 is a substrate formed of a polycrystal, and it is possible to use, e.g., a polycrystalline SiC substrate, a polycrystalline diamond substrate, a polycrystalline Si substrate, a polycrystalline $Al_2O_3$ substrate and a polycrystalline AlN substrate as the polycrystalline substrate 11. In general, polycrystal is produced easier than a single crystal, hence, it is low in cost.

The single crystal $Ga_2O_3$-based substrate 10 alone is cleaved and broken along a cleavage plane such as a (100) plane or a (001) plane in the event of occurrence of crack and thus has a relatively low fracture toughness value. On the other hand, the polycrystalline substrate 11 is less likely to break since cracks, even when occurred, are stopped from advancing by the crystal grain boundaries. Thus, the fracture toughness value of the polycrystalline substrate 11 is higher than the fracture toughness value of the single crystal $Ga_2O_3$-based substrate 10. Furthermore, to impart sufficient strength to the semiconductor substrate 1, the fracture toughness value of the polycrystalline substrate 11 (a value obtained by a fracture toughness test in accordance with JIS R 1607) is preferably not less than 3 $MPa \cdot m^{1/2}n$ which is higher than the fracture toughness value of the single crystal $Ga_2O_3$-based substrate 10 regardless of the plane orientation of the principal plane of the single crystal $Ga_2O_3$-based substrate 10.

The semiconductor substrate 1, which is formed by bonding the single crystal $Ga_2O_3$-based substrate 10 to the polycrystalline substrate 11 with excellent fracture toughness, has a much higher fracture toughness value and is less breakable than a single crystal $Ga_2O_3$-based substrate of the same thickness.

In addition, in the semiconductor substrate 1 which is formed by bonding the single crystal $Ga_2O_3$-based substrate 10 to the polycrystalline substrate 11, the single crystal $Ga_2O_3$-based substrate 10 is less likely to break and can be reduced in thickness, allowing for the cost reduction. For this reason, the thickness of the single crystal $Ga_2O_3$-based substrate 10 is preferably smaller than the thickness of the polycrystalline substrate 11.

In addition, since the amount of dopant which can be implanted into the polycrystalline substrate 11 is much larger than for a single crystal substrate, it is possible to reduce resistivity. This is because crystal quality of single crystal substrates is degraded due to defects caused when introducing too much dopant and there is thus an upper limit to the amount of dopant to be implanted, but crystal quality of polycrystalline substrates is hardly affected by an increase in defects.

For example, while resistivity of a commonly used single crystal SiC substrate can be reduced to about 0.02 Ω·cm by implanting N (nitrogen) to the extent that the quality thereof is not affected, resistivity of a polycrystalline SiC substrate can be reduced to not more than 0.01 Ω·cm by implanting N.

As such, resistivity of the polycrystalline substrate 11 can be reduced. Therefore, when used as a substrate for, e.g., a vertical semiconductor element, power loss of the semiconductor element can be reduced.

In addition, when a substrate formed of a material with a higher thermal conductivity than a $Ga_2O_3$-based single crystal, such as a polycrystalline SiC substrate, is used as the polycrystalline substrate 11, the semiconductor substrate 1 can have higher heat dissipation properties than a single-layered $Ga_2O_3$-based single crystal substrate of the same thickness. For example, while thermal conductivity of single crystal $Ga_2O_3$ is 13.6 W/(m·K) in a [100] direction and 22.8 W/(m·K) in a [010] direction, thermal conductivities of polycrystalline SiC, polycrystalline $Al_2O_3$ and polycrystalline AlN are respectively about 330 W/(m·K), 32 W/(m·K) and 150 W/(m·K).

By using a substrate with a particularly high thermal conductivity such as a SiC polycrystalline substrate or a polycrystalline diamond substrate as the polycrystalline substrate 11, it is possible to further improve the heat dissipation properties of the semiconductor substrate 1.

In addition, to prevent warping, etc., of the semiconductor substrate 1, the polycrystalline substrate 11 is preferably formed of a material having a small difference in thermal expansion coefficient from the $Ga_2O_3$-based single crystal which is the material of the single crystal $Ga_2O_3$-based substrate 10. Examples of polycrystalline material having a small difference in thermal expansion coefficient from the $Ga_2O_3$-based single crystal ($5.3 \times 10^{-6}$/K in a [100] direction, $8.9 \times 10^{-6}$/K in a [010] direction and $8.2 \times 10^{-6}$/K in a [001] direction) include polycrystalline SiC ($4.0 \times 10^{-6}$/K), polycrystalline $Al_2O_3$ ($7.2 \times 10^{-6}$/K) and polycrystalline AlN ($4.6 \times 10^{-6}$/K).

(Method for Producing the Semiconductor Substrate)

An example of a method for producing the semiconductor substrate 1 will be described below. In the example described below, plural single crystal $Ga_2O_3$-based substrates 10 of the semiconductor substrates 1 are formed from one single crystal $Ga_2O_3$-based substrate, with layer splitting technology involving ablation by hydrogen atoms (also called Smart Cut™).

FIGS. 2A to 2E are vertical cross-sectional views showing a process of producing the semiconductor substrate 1 of the first embodiment.

Firstly, a single crystal $Ga_2O_3$-based substrate 12 and the polycrystalline substrate 11 are prepared. Then, their surfaces to be bonded (hereinafter, referred to as "bonding surfaces") are flattened by CMP (chemical mechanical polishing) or machine polishing, etc.

Figure 2A:
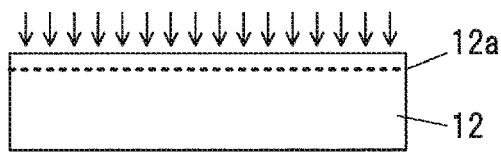
FIG. 2A is a vertical cross-sectional view showing a hydrogen ion implantation step in a process of producing the semiconductor substrate.

Next, as shown in FIG. 2A, a hydrogen ion implanted layer 12a is formed in the single crystal $Ga_2O_3$-based substrate 12 by implanting hydrogen ions to a portion with a predetermined depth from the bonding surface.

A layer split from the single crystal $Ga_2O_3$-based substrate 12 at the hydrogen ion implanted layer 12a serving as a splitting plane is to be the single crystal $Ga_2O_3$-based substrate 10 of the semiconductor substrate 1, as described later. Thus, the depth of the hydrogen ion implanted layer 12a from the bonding surface of the single crystal $Ga_2O_3$-based substrate 12 is determined according to the thickness of the single crystal $Ga_2O_3$-based substrate 10 intended to be formed.

Figure 2B:
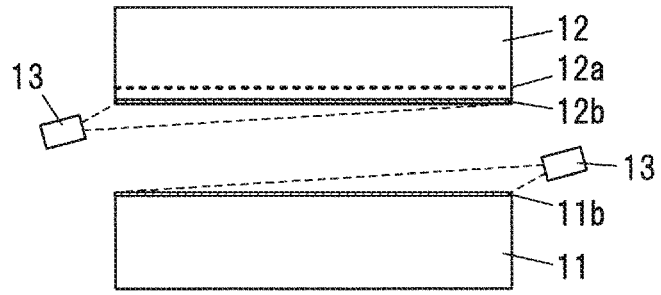
FIG. 2B is a vertical cross-sectional view showing a bonding surface modification step in the process of producing the semiconductor substrate.

Next, as shown in FIG. 2B, an amorphous layer 12b and an amorphous layer 11b are respectively formed on the single crystal $Ga_2O_3$-based substrate 12 and the polycrystalline substrate 11 by modifying the bonding surfaces thereof.

When Ar neutral atom beam is emitted onto the bonding surfaces of the single crystal $Ga_2O_3$-based substrate 12 and the polycrystalline substrate 11 by FAB guns 13, etc., in a vacuum chamber, the surfaces are damaged and changed from crystalline to amorphous, and the amorphous layer 12b and the amorphous layer 11b are thereby formed.

In the step of forming the amorphous layer 12b and the amorphous layer 11b, atomic bonds are exposed by removing an oxide film or an adsorption layer from the bonding surfaces of the single crystal $Ga_2O_3$-based substrate 12 and the polycrystalline substrate 11, and the surfaces are thereby activated. In addition, since this step is performed in vacuum, oxidation, etc., of the activated surfaces does not occur and the activated state is maintained.

Figure 2C:
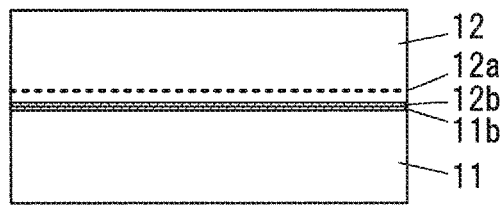
FIG. 2C is a vertical cross-sectional view showing a bonding surface contacting step in the process of producing the semiconductor substrate.

Next, as shown in FIG. 2C, the amorphous layer 12b of the single crystal $Ga_2O_3$-based substrate 12 is brought into contact with the amorphous layer 11b of the polycrystalline substrate 11 in vacuum. The single crystal $Ga_2O_3$-based substrate 12 and the polycrystalline substrate 11, after being brought into contact with each other, may be fixed by a jig, etc., to prevent separation.

Figure 2D:
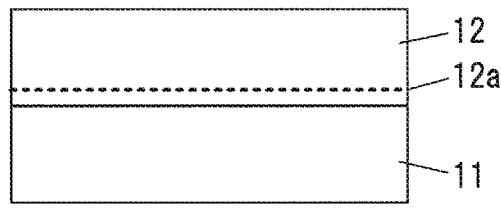
FIG. 2D is a vertical cross-sectional view showing a heat treatment step in the process of producing the semiconductor substrate.

Next, as shown in FIG. 2D, heat treatment is performed on the single crystal $Ga_2O_3$-based substrate 12 and the polycrystalline substrate 11 in the state in which the amorphous layer 12b is in contact with the amorphous layer 11b, thereby bonding the single crystal $Ga_2O_3$-based substrate 12 to the polycrystalline substrate 11. The heat treatment may be performed under reduced pressure in the vacuum chamber or may be performed in another furnace other than the vacuum chamber.

By performing the heat treatment, both the amorphous layer 12b and the amorphous layer 11b are recrystallized, resulting in that the single crystal $Ga_2O_3$-based substrate 12 and the polycrystalline substrate 11 are bonded firmly due to covalent bonding. The higher the heat treatment temperature, the higher the bonding strength. For example, when the polycrystalline substrate 11 is a polycrystalline SiC substrate, stronger bonding is obtained by performing heat treatment at not less than 800° C.

In addition, with the heat treatment, it is possible to break the single crystal $Ga_2O_3$-based substrate 12 at the hydrogen ion implanted layer 12a. Furthermore, the temperature of the heat treatment is preferably not more than 1100° C. so that evaporation of the single crystal $Ga_2O_3$-based substrate 12 or diffusion of impurities can be prevented.

Figure 2E:
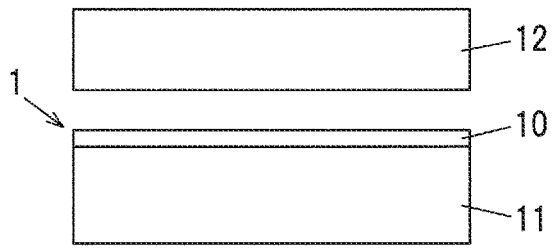
FIG. 2E is a vertical cross-sectional view showing a semiconductor substrate separation step in the process of producing the semiconductor substrate.

Next, as shown in FIG. 2E, the single crystal $Ga_2O_3$-based substrate 12 is split along the hydrogen ion implanted layer 12a as a broken position. As a result, a layer of the single crystal $Ga_2O_3$-based substrate 12 located on the polycrystalline substrate 11 side of the hydrogen ion implanted layer 12a and bonded to the polycrystalline substrate 11 is left on the polycrystalline substrate 11. The portion of the single crystal $Ga_2O_3$-based substrate 12 left on the polycrystalline substrate 11 is the single crystal $Ga_2O_3$-based substrate 10 of the semiconductor substrate 1.

After that, the process shown in FIGS. 2A to 2E is repeated, while each time using the portion of the single crystal $Ga_2O_3$-based substrate 12 separated from the polycrystalline substrate 11 as the single crystal $Ga_2O_3$-based substrate 12 shown in FIG. 2A. It is thereby possible to form plural single crystal $Ga_2O_3$-based substrates 10 of the semiconductor substrates 1 from one single crystal $Ga_2O_3$-based substrate 12.

Effects of the First Embodiment

The semiconductor substrate 1 in the first embodiment including the single crystal $Ga_2O_3$-based substrate 12 can be used for the same application as a single crystal $Ga_2O_3$-based substrate alone, is less breakable than the single crystal $Ga_2O_3$-based substrate, alone, of the same thickness, and allows for a low production cost.

In addition, by using a substrate formed of a material with a higher thermal conductivity than a $Ga_2O_3$-based single crystal, such as a polycrystalline SiC substrate, as the polycrystalline substrate 11 of the semiconductor substrate 1, it is possible to improve heat dissipation of a semiconductor element formed using the semiconductor substrate 1.

Second Embodiment

The second embodiment is an embodiment of a semiconductor element formed using the semiconductor substrate in the first embodiment.

Figure 3:
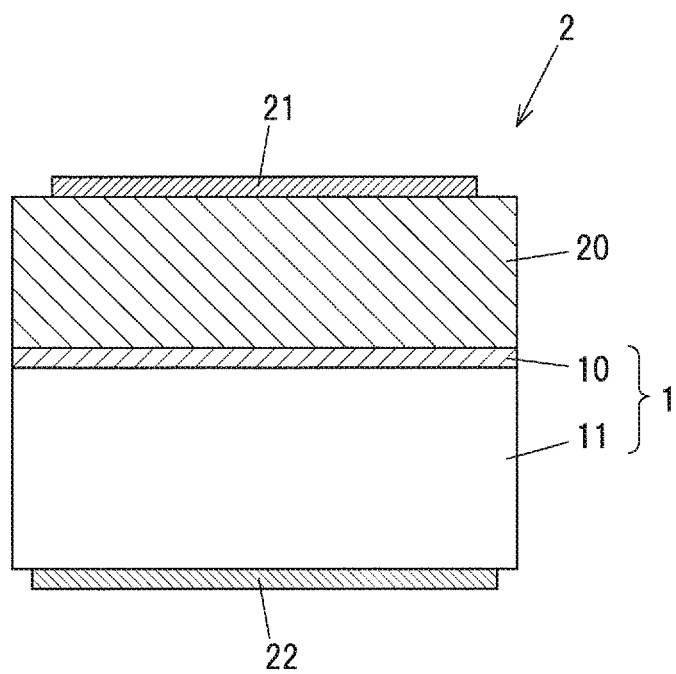
FIG. 3 is a vertical cross-sectional view showing a Schottky barrier diode in the second embodiment.

FIG. 3 is a vertical cross-sectional view showing a Schottky barrier diode 2 in the second embodiment. The Schottky barrier diode 2 is a vertical Schottky barrier diode and has the semiconductor substrate 1, a single crystal $Ga_2O_3$-based layer 20 on the single crystal $Ga_2O_3$-based substrate 10 of the semiconductor substrate 1, an anode electrode 21 connected to the single crystal $Ga_2O_3$-based layer 20, and a cathode electrode 22 connected to the polycrystalline substrate 11 of the semiconductor substrate 1.

The single crystal $Ga_2O_3$-based substrate 10 is, e.g., a single crystal $Ga_2O_3$ substrate having a thickness of 0.1 to 10 μm and a carrier concentration of $1\times10^{18}$ to $1\times10^{20}$ $cm^{-3}$. Si or Sn, etc., is used as a dopant to be implanted into the single crystal $Ga_2O_3$-based substrate 10. In the single crystal $Ga_2O_3$-based substrate 10, the higher the carrier concentration, the lower the conduction loss. However, crystal defects may occur when the doping density is large. Therefore, the carrier concentration in the single crystal $Ga_2O_3$-based substrate 10 is preferably set within a range of $3\times10^{18}$ to $5\times10^{20}$ $cm^{-3}$.

The polycrystalline substrate 11 is, e.g., a polycrystalline SiC substrate having a thickness of 50 to 1000 μm and a carrier concentration of $1\times10^{18}$ to $1\times10^{20}$ $cm^{-3}$. N, etc., is used as a dopant to be implanted into the polycrystalline substrate 11.

The single crystal $Ga_2O_3$-based layer 20 is a layer formed on the single crystal $Ga_2O_3$-based substrate 10 by epitaxial crystal growth and is, e.g., a single crystal $Ga_2O_3$ layer having a thickness of 1 to 100 μm and a carrier concentration of $1\times10^{14}$ to $1\times10^{17}$ $cm^{-3}$. Si or Sn, etc., is used as a dopant to be implanted into the single crystal $Ga_2O_3$-based layer 20. The carrier concentration in the single crystal $Ga_2O_3$-based layer 20 is typically lower than the carrier concentrations in the single crystal $Ga_2O_3$-based substrate 10 and the polycrystalline substrate 11.

The anode electrode 21 has, e.g., a stacked structure of Pt/Ti/Au and is in Schottky contact with the single crystal $Ga_2O_3$-based layer 20. The Pt layer, the Ti layer and the Au layer in this case are respectively, e.g., 15 nm, 5 nm and 200 nm in thickness.

The cathode electrode 21 has, e.g., a stacked structure of Ti/Au and is in ohmic contact with the polycrystalline substrate 11. The Ti layer and the Au layer in this case are respectively, e.g., 50 nm and 200 nm in thickness.

In the Schottky barrier diode 2, an energy barrier at an interface between the anode electrode 21 and the single crystal $Ga_2O_3$-based layer 20 as viewed from the single crystal $Ga_2O_3$-based layer 20 is lowered by applying forward voltage between the anode electrode 21 and the cathode electrode 21 (positive potential on the anode electrode 21 side), allowing a current to flow from the anode electrode 21 to the cathode electrode 22. On the other hand, when reverse voltage is applied between the anode electrode 21 and the cathode electrode 21 (negative potential on the anode electrode 21 side), the flow of current is interrupted by the Schottky barrier.

Figure 4:
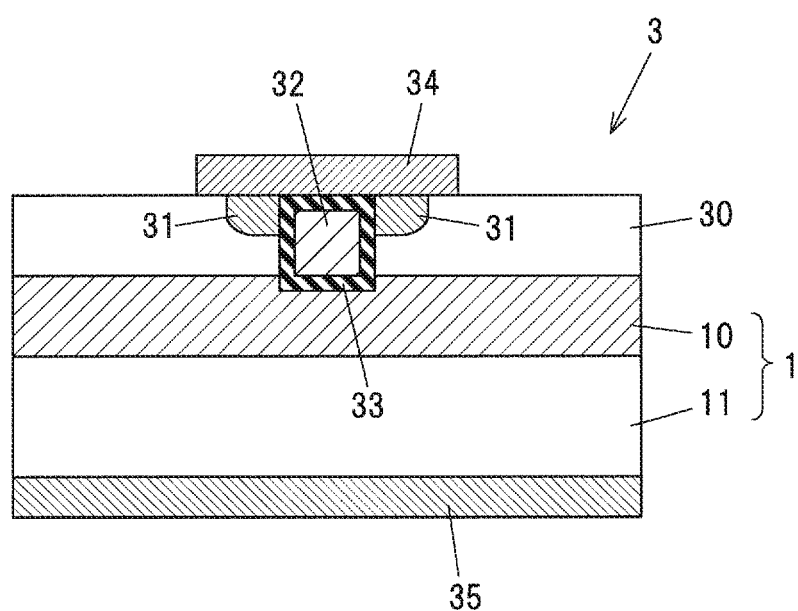
FIG. 4 is a vertical cross-sectional view showing a MOS-FET in the second embodiment.

FIG. 4 is a vertical cross-sectional view showing a MOSFET 3 in the second embodiment. The MOSFET 3 is a vertical MOSFET (Metal-Oxide-Semiconductor Field-Effect Transistor) with a DMOS structure (Double-diffused MOSFET), and has the semiconductor substrate 1, a single crystal $Ga_2O_3$-based layer 30 on the single crystal $Ga_2O_3$-based substrate 10 of the semiconductor substrate 1, a gate electrode 32 covered with a gate insulating film 33 and buried in the single crystal $Ga_2O_3$-based layer 30, contact regions 31 formed in the single crystal $Ga_2O_3$-based layer 30 on the both sides of the gate electrode 32, a source electrode 34 formed on the single crystal $Ga_2O_3$-based layer 30 and connected to the contact regions 31, and a drain electrode 35 connected to the polycrystalline substrate 11 of the semiconductor substrate 1.

The single crystal $Ga_2O_3$-based substrate 10 is, e.g., an n-type single crystal $Ga_2O_3$ substrate having a thickness of 10 to 500 nm and a carrier concentration of $1\times10^{15}$ to $1\times10^{19}$ $cm^{-3}$. Si or Sn, etc., is used as a dopant to be implanted into the single crystal $Ga_2O_3$-based substrate 10. In the single crystal $Ga_2O_3$-based substrate 10, the higher the carrier concentration, the lower the conduction loss. However, crystal defects may occur when the doping density is large. Therefore, the carrier concentration in the single crystal $Ga_2O_3$-based substrate 10 is preferably set within a range of $3\times10^{18}$ to $5\times10^{19}$ $cm^{-3}$.

The polycrystalline substrate 11 is, e.g., an n-type polycrystalline SiC substrate having a thickness of 100 to 600 μm and a carrier concentration of $5\times10^{18}$ to $1\times10^{20}$ $cm^{-3}$. N, etc., is used as a dopant to be implanted into the polycrystalline substrate 11.

The single crystal $Ga_2O_3$-based layer 30 is a layer formed on the single crystal $Ga_2O_3$-based substrate 10 by epitaxial crystal growth and is, e.g., an undoped (with no intentionally added dopant) or p-type single crystal $Ga_2O_3$ layer having a thickness of 0.1 to 100 μm.

The gate electrode 32, the source electrode 34 and the drain electrode 35 are formed of, e.g., a metal such as Au, Al, Ti, Sn, Ge, In, Ni, Co, Pt, W, Mo, Cr, Cu and Pb, an alloy containing two or more of such metals, a conductive compound such as ITO, or a conductive polymer. The conductive polymer to be used is, e.g., a polythiophene derivative (PEDOT: poly(3,4)-ethylenedioxythiophene) doped with polystyrene sulfonate (PSS) or a polypyrrole derivative doped with TCNA, etc. In addition, the gate electrode 32 may have a two-layer structure composed of two different metals, e.g., Al/Ti, Au/Ni or Au/Co.

The gate insulating film 33 is formed of an insulating material such as $SiO_2$, AlN, SiN, $Al_2O_3$ or $\beta\text{-}(Al_xGa_{1-x})_2O_3$ ($0 \le x \le 1$).

The contact region 31 is a region with a high n-type dopant concentration formed by, e.g., ion implantation into the single crystal $Ga_2O_3$-based layer 30. Si or Sn, etc., is used as a dopant to be implanted into the contact region 31.

In the MOSFET 3, when a voltage of not less than a threshold is applied to the gate electrode 32, channels are formed in regions of the single crystal $Ga_2O_3$-based layer 30 on the both sides of the gate electrode 32 and current flows from the source electrode 34 to the drain electrode 35.

Effects of the Second Embodiment

The Schottky barrier diode 2 and the MOSFET 3 in the second embodiment are formed using the semiconductor substrate 1 in the first embodiment and are thus less breakable and is lower in production cost than when a single crystal $Ga_2O_3$-based substrate is used alone. In addition, by using a substrate formed of a material with a higher thermal conductivity than a $Ga_2O_3$-based single crystal, such as a polycrystalline SiC substrate, as the polycrystalline substrate 11 of the semiconductor substrate 1, it is possible to improve heat dissipation of the Schottky barrier diode 2.

In the second embodiment, Schottky barrier diode and MOSFET have been described as examples of semiconductor elements formed using the semiconductor substrate 1 in the first embodiment. However, the same effects can be obtained when the semiconductor substrate 1 is used to form other semiconductor elements.

Examples

The semiconductor substrate 1 in the first embodiment was made by the surface activated bonding method, using a single crystal $Ga_2O_3$ substrate as the single crystal $Ga_2O_3$-based substrate 10 and a polycrystalline SiC substrate as the polycrystalline substrate 11, and various evaluations were conducted.

(Condition of the Bonded Interface)

Figure 5:
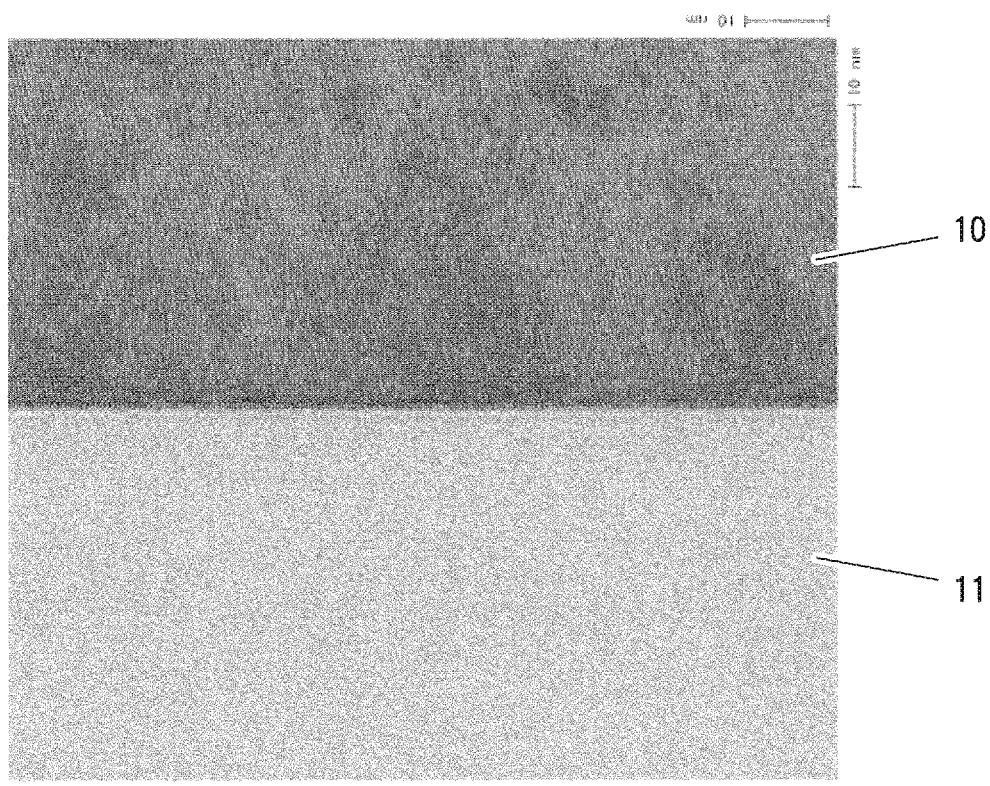
FIG. 5 is a transmission electron microscope (TEM) image obtained by observing the bonded interface between a single crystal $Ga_2O_3$ substrate and a polycrystalline SiC substrate.

FIG. 5 is a transmission electron microscope (TEM) image obtained by observing the bonded interface between the single crystal $Ga_2O_3$ substrate and the polycrystalline SiC substrate. The plane orientation of the principal plane of the single crystal $Ga_2O_3$ substrate in FIG. 5 is (010). The single crystal $Ga_2O_3$ substrate and the polycrystalline SiC substrate in FIG. 5 were not heat-treated at the time of bonding.

The TEM image in FIG. 5 shows that, at the bonded interface between the single crystal $Ga_2O_3$ substrate and the polycrystalline SiC substrate, there is no intermediate layer or precipitation of foreign substances, etc., and a good bonded state was formed.

From this result, it was confirmed that the semiconductor substrate 1 in the first embodiment with good bonded interface condition can be formed by the surface activated bonding method.

(Plane Orientation of the Single Crystal $Ga_2O_3$ Substrate)

Heat treatment was performed on two types of semiconductor substrates 1 of which single crystal $Ga_2O_3$ substrates respectively have principal planes oriented to (010) and (001), and a relation between the plane orientation of the principal plane of the single crystal $Ga_2O_3$ substrate and heat resistance of the semiconductor substrate 1 was examined.

When heat treatment at 500° C. was performed on the semiconductor substrate 1 with the single crystal $Ga_2O_3$ substrate having the (010)-oriented principal plane, cracks occurred and the bonded area between the single crystal $Ga_2O_3$ substrate and the polycrystalline SiC substrate was reduced.

In case of the semiconductor substrate 1 with the single crystal $Ga_2O_3$ substrate having the (001)-oriented principal plane, even when heat treatments at 800° C. and 1000° C. were performed, cracks did not occur and reduction in the bonded area between the single crystal $Ga_2O_3$ substrate and the polycrystalline SiC substrate was not observed.

From this result, it was found that high heat resistance is obtained when the semiconductor substrate 1 in the first embodiment is configured so that the single crystal $Ga_2O_3$-based substrate 10 has the (001)-oriented principal plane.

In addition, since the (001) plane is one of cleavage planes of $Ga_2O_3$-based single crystal, the single crystal $Ga_2O_3$-based substrate can be easily split in the surface activated bonding method (see FIGS. 2D and 2E).

(Heat Treatment Temperature)

Bonding strength of the semiconductor substrate 1 when heat-treated at 500° C., 800° C. and 1000° C. and not heat-treated in the surface activated bonding method was examined by a tensile test in accordance with JIS R 1630. The plane orientation of the principal plane of the single crystal $Ga_2O_3$ substrate of the semiconductor substrate 1 subjected to the test was (001).

In case that bonding was performed by the surface activated bonding method at room temperature without performing heat treatment, separation occurred at the bonded interface between the single crystal $Ga_2O_3$ substrate and the polycrystalline SiC substrate at the time that tensile strength was increased to 3 MPa.

In case that heat treatment at 500° C. was performed in the surface activated bonding, separation occurred at the bonded interface between the single crystal $Ga_2O_3$ substrate and the polycrystalline SiC substrate at the time that tensile strength was increased to 7.5 MPa.

In case that heat treatment at 800° C. was performed in the surface activated bonding, fracture of the single crystal $Ga_2O_3$ substrate (bulk fracture) occurred at the time that tensile strength was increased to 11.7 MPa. In other words, fracture of the single crystal $Ga_2O_3$ substrate occurred before separation occurred at the bonded interface between the single crystal $Ga_2O_3$ substrate and the polycrystalline SiC substrate.

In case that heat treatment at 1000° C. was performed in the surface activated bonding, fracture of the single crystal $Ga_2O_3$ substrate (bulk fracture) occurred at the time that tensile strength was increased to 9.8 MPa. In other words, fracture of the single crystal $Ga_2O_3$ substrate occurred before separation occurred at the bonded interface between the single crystal $Ga_2O_3$ substrate and the polycrystalline SiC substrate.

It is sufficient if the bonding strength at the bonded interface (the lowest tensile strength causing separation at the interface) is not less than bulk fracture strength. Therefore, the bonding strength of the semiconductor substrate 1 when heat-treated at not less than 800° C. is enough for practical use.

From this result, it was found that stronger bonding between the single crystal $Ga_2O_3$ substrate and the polycrystalline SiC substrate is obtained when heat treatment at not less than 800° C. is performed in the surface activated bonding method.

Meanwhile, variation in the measured value in the tensile test is about ±15%. Therefore, fracture of the single crystal $Ga_2O_3$ substrate may occur at a tensile strength of 8.3 MPa which is 15% lower than 9.8 MPa. Based on this, the bonding strength at the bonded interface between the single crystal Ga$_2$O$_3$-based substrate 10 and the polycrystalline substrate 11 in the semiconductor substrate 1 is preferably not less than 8.3 MPa.

(Fracture Toughness)

A fracture toughness test was conducted on three types of single crystal Ga$_2$O$_3$ substrates with principal planes oriented to (001), (010), (−201) and on the polycrystalline SiC substrate by the indentation fracture (IF) method in accordance with JIS R 1607. The test conditions are shown in Table 1 below, the test results (fracture toughness, Kc[MPa·m$^{1/2}$]) of the single crystal Ga$_2$O$_3$ substrates are shown in Table 2, and the test results (fracture toughness, Kc[MPa·m$^{1/2}$]) of the polycrystalline SiC substrate are shown in Table 3.

TABLE 1

| | |
|---|---|
| Temperature, Humidity | 25° C., 20% |
| Load | 1-2 kgf |
| Load application rate | 10 μm/s |
| Holding time | 15 seconds |
| Number of indentations | Five points per sample |
| Elastic modulus (indenter method) | (001) Ga$_2$O$_3$: 194 GPa |
| | (010) Ga$_2$O$_3$: 151 GPa |
| | (−201) Ga$_2$O$_3$: 190 GPa |
| | Poly-SiC: 515 GPa |

In "Elastic modulus" of Table 1, "(001) Ga$_2$O$_3$", "(010) Ga$_2$O$_3$", "(−201) Ga$_2$O$_3$" and "Poly-SiC" respectively mean the single crystal Ga$_2$O$_3$ substrate with the principal plane oriented to (001), the single crystal Ga$_2$O$_3$ substrate with the principal plane oriented to (010), the single crystal Ga$_2$O$_3$ substrate with the principal plane oriented to (−201), and the polycrystalline SiC substrate.

TABLE 2

| | 1$^{st}$ point | 2$^{nd}$ point | 3$^{rd}$ point | 4$^{th}$ point | 5$^{th}$ point | Average |
|---|---|---|---|---|---|---|
| (001) Ga$_2$O$_3$ | 2.6 | 2.4 | 2.5 | 2.5 | 2.0 | 2.4 |
| (010) Ga$_2$O$_3$ | 0.4 | 0.4 | 0.4 | 0.4 | 0.5 | 0.4 |
| (−201) Ga$_2$O$_3$ | 1.5 | 2.0 | 2.1 | 2.9 | 1.5 | 2.0 |
| Average of three plane orientations | | | — | | | 1.6 |

TABLE 3

| | Poly-SiC |
|---|---|
| 1$^{st}$ point | 4.8 |
| 2$^{nd}$ point | 4.4 |
| 3$^{rd}$ point | 5.4 |
| 4$^{th}$ point | 4.8 |
| 5$^{th}$ point | 4.7 |
| 6$^{th}$ point | 5.2 |
| 7$^{th}$ point | 5.6 |
| 8$^{th}$ point | 5.5 |
| 9$^{th}$ point | 3.8 |
| 10$^{th}$ point | 6.2 |
| Average | 5.0 |

In Table 2, "Average" means the average of fracture toughness values measured at five points on the substrate, and "Average of three plane orientations" means the average of the average fracture toughness values for the three types of single crystal Ga$_2$O$_3$ substrates described above. In Table 3, "Average" means the average of fracture toughness values measured at ten points on the substrate.

Since the characteristics of the single crystal Ga$_2$O$_3$ substrate are different depending on the plane orientation, the test was conducted on the substrates having three typical plane orientations. The fracture toughness values of the three types of single crystal Ga$_2$O$_3$ substrates of different plane orientations are all lower than the fracture toughness value of the polycrystalline SiC substrate, which shows that the single crystal Ga$_2$O$_3$ substrates are very breakable as compared to the polycrystalline SiC substrate. In addition, variation in the fracture toughness value among the measured points was also larger for the single crystal Ga$_2$O$_3$ substrates than for the SiC substrate.

(Current-Voltage Characteristics)

Current-voltage characteristics of the semiconductor substrate 1 were measured.

Figure 6A:
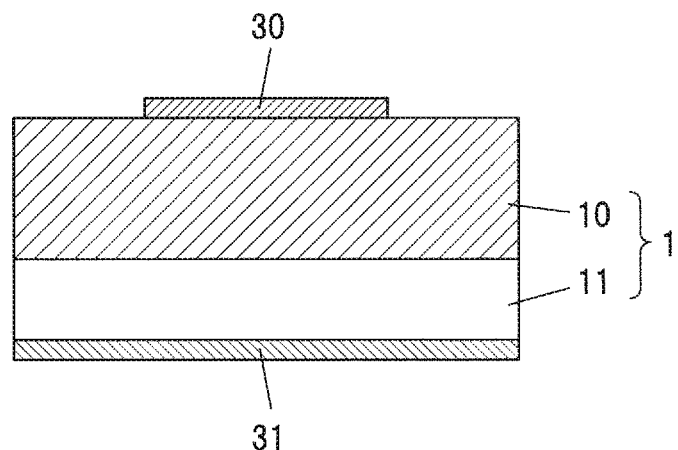
FIG. 6A is a vertical cross-sectional view showing the semiconductor substrate to which electrodes for measurement are connected.

FIG. 6A is a vertical cross-sectional view showing the semiconductor substrate 1 to which electrodes for measurement are connected. The single crystal Ga$_2$O$_3$ substrate as the single crystal Ga$_2$O$_3$-based substrate 10 and the polycrystalline SiC substrate as the polycrystalline substrate 11 in the semiconductor substrate 1 were respectively 610 μm and 350 μm in thickness. Si atoms were doped by ion implantation into the single crystal Ga$_2$O$_3$ substrate in the region from the surface to the depth of 150 nm so that a box profile with a concentration of 5×10$^{19}$ cm$^{−3}$ was formed, and activation annealing was then performed in a nitrogen gas atmosphere at a substrate temperature of 950° C. for 30 minutes. After that, a 400 μm-diameter circular Ti/Au electrode 30 was formed on the surface of the single crystal Ga$_2$O$_3$ substrate and a Ti/Au electrode 31 was formed on the entire surface of the polycrystalline SiC substrate. In this process, an ohmic contact was obtained between the Ti/Au electrode 30 and the single crystal Ga$_2$O$_3$ substrate and between the Ti/Au electrode 31 and the polycrystalline SiC substrate.

Figure 6B:
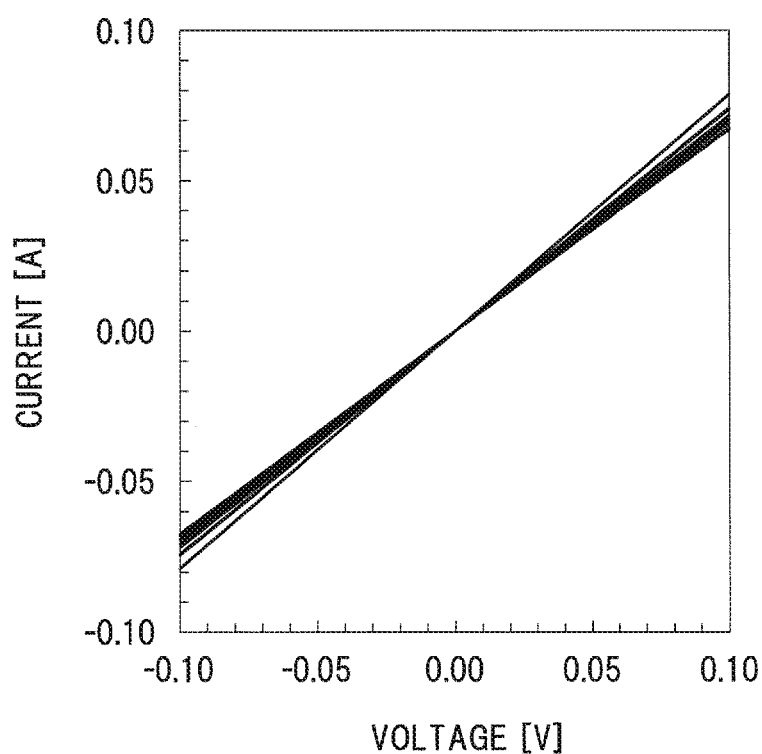
FIG. 6B is a graph showing the measured current-voltage characteristics of the semiconductor substrate.

FIG. 6B is a graph showing the current-voltage characteristics of the semiconductor substrate 1 measured between the Ti/Au electrode 30 and the Ti/Au electrode 31. Based on FIG. 6B, a linear current-voltage characteristic was obtained. From this, it was found that any electrical barrier does not exist and an ohmic contact is formed at the bonded interface between the single crystal Ga$_2$O$_3$ substrate as the single crystal Ga$_2$O$_3$-based substrate 10 and the polycrystalline SiC substrate as the polycrystalline substrate 11 in the semiconductor substrate 1.

(Thermal Conductivity)

With various ratios of the thickness of the single crystal Ga$_2$O$_3$-based substrate 10 to the thickness of the polycrystalline substrate 11, vertical thermal conductivity of the semiconductor substrate 1 was calculated. Table 4 below shows a relation between the ratio [%] of the thickness of the single crystal Ga$_2$O$_3$-based substrate 10 to the thickness of the polycrystalline substrate 11 and vertical thermal conductivity [W/(m·K)] of the semiconductor substrate 1.

TABLE 4

| Thickness of Ga$_2$O$_3$ layer [μm] | Thickness of SiC layer [μm] | Ga$_2$O$_3$/SiC [%] | Thermal conductivity of bonded substrate [W/mK] |
|---|---|---|---|
| 1 | 350 | 0.3 | 317.8 |
| 11 | 350 | 3.1 | 234.0 |
| 15 | 350 | 4.3 | 212.4 |
| 20 | 350 | 5.7 | 190.9 |
| 30 | 350 | 8.6 | 159.9 |
| 40 | 350 | 11.4 | 138.5 |
| 50 | 350 | 14.3 | 122.9 |

TABLE 4-continued

| Thickness of Ga$_2$O$_3$ layer [µm] | Thickness of SiC layer [µm] | Ga$_2$O$_3$/SiC [%] | Thermal conductivity of bonded substrate [W/mK] |
|---|---|---|---|
| 60 | 350 | 17.1 | 111.0 |
| 70 | 350 | 20.0 | 101.7 |
| 80 | 350 | 22.9 | 94.1 |
| 90 | 350 | 25.7 | 87.9 |
| 100 | 350 | 28.6 | 82.6 |
| 200 | 350 | 57.1 | 55.9 |
| 300 | 350 | 85.7 | 45.7 |
| 400 | 350 | 114.3 | 40.3 |
| 500 | 350 | 142.9 | 37.0 |
| 600 | 350 | 171.4 | 34.7 |

In Table 4, "Thickness of Ga$_2$O$_3$ layer", "Thickness of SiC layer" and "Ga$_2$O$_3$/SiC" respectively mean the thickness of the single crystal Ga$_2$O$_3$ substrate as the single crystal Ga$_2$O$_3$-based substrate 10, the thickness of the polycrystalline SiC substrate as the polycrystalline substrate 11 and the ratio of the thickness of the single crystal Ga$_2$O$_3$ substrate to the thickness of the polycrystalline SiC substrate, and "Thermal conductivity of bonded substrate" means vertical thermal conductivity of the semiconductor substrate 1 which is composed of the single crystal Ga$_2$O$_3$ substrate and the polycrystalline SiC substrate bonded thereto.

Figure 7:
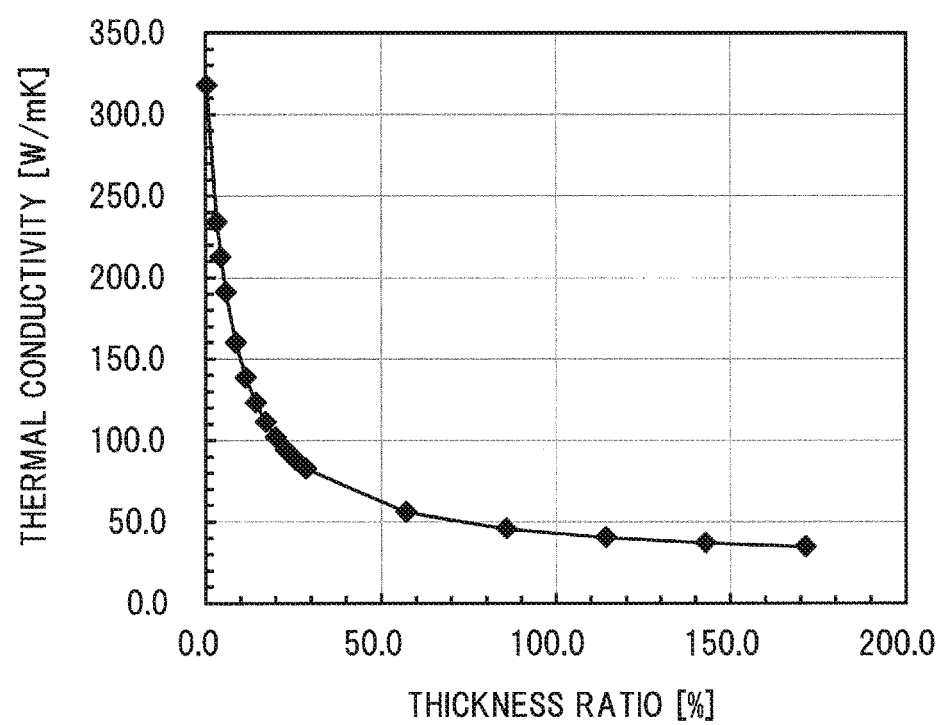
FIG. 7 is a graph plotting a relation between a ratio of the thickness of the single crystal $Ga_2O_3$ substrate to the thickness of the polycrystalline SiC substrate and vertical thermal conductivity of the semiconductor substrate shown in Table 4.

FIG. 7 is a graph plotting a relation between the ratio of the thickness of the single crystal Ga$_2$O$_3$ substrate to the thickness of the polycrystalline SiC substrate and vertical thermal conductivity of the semiconductor substrate shown in Table 4.

Based on Table 4 and FIG. 7, the semiconductor substrate 1 has a vertical thermal conductivity of not less than 100 W/(m·K), not less than 150 W/(m·K) and not less than 200 W/(m·K) respectively when the ratio of the thickness of the single crystal Ga$_2$O$_3$-based substrate 10 to the thickness of the polycrystalline substrate 11 is not more than 20%, not more than 10% and not more than 5%.

Although the embodiments and Examples of the invention have been described, the invention is not intended to be limited to the embodiments and Examples, and the various kinds of modifications can be implemented without departing from the gist of the invention.

In addition, the invention according to claims is not to be limited to the embodiments and Examples described above. Further, it should be noted that all combinations of the features described in the embodiments and Examples are not necessary to solve the problem of the invention.

INDUSTRIAL APPLICABILITY

Provided is a semiconductor substrate which includes a layer formed of a Ga$_2$O$_3$-based single crystal and is excellent in mechanical strength, a semiconductor element including such a semiconductor substrate, and a method for producing such a semiconductor substrate.

REFERENCE SIGNS LIST

1 SEMICONDUCTOR SUBSTRATE
2 SCHOTTKY BARRIER DIODE
10, 12 SINGLE CRYSTAL Ga$_2$O$_3$-BASED SUBSTRATE
11 POLYCRYSTALLINE SUBSTRATE
11$b$, 12$b$ AMORPHOUS LAYER

The invention claimed is:

1. A semiconductor substrate, comprising a single crystal Ga$_2$O$_3$-based substrate and a polycrystalline substrate that are bonded to each other,
   wherein a thickness of the single crystal Ga$_2$O$_3$-based substrate is smaller than a thickness of the polycrystalline substrate, and a fracture toughness value of the polycrystalline substrate is higher than a fracture toughness value of the single crystal Ga$_2$O$_3$-based substrate,
   wherein the single crystal Ga$_2$O$_3$-based substrate comprises a principal plane comprising a (001) plane,
   wherein the polycrystalline substrate comprises a polycrystalline SiC substrate, and
   wherein a bonding strength between the single crystal Ga$_2$O$_3$-based substrate and the polycrystalline substrate is not less than 8.3 MPa.

2. The semiconductor substrate according to claim 1, wherein the fracture toughness value of the polycrystalline substrate is not less than 3 MPa·m$^{1/2}$.

3. The semiconductor substrate according to claim 1, wherein a ratio of the thickness of the single crystal Ga$_2$O$_3$-based substrate to the thickness of the polycrystalline substrate is not more than about 20%.

4. The semiconductor substrate according to claim 1, wherein the single crystal Ga$_2$O$_3$-based substrate has a carrier concentration of not less than $3 \times 10^{18}$ cm$^{-3}$.

5. A semiconductor element, comprising the semiconductor substrate according to claim 1.

6. A method for producing a semiconductor substrate, comprising:
   forming a first amorphous layer by damaging a surface of a single crystal Ga$_2$O$_3$-based substrate and forming a second amorphous layer by damaging a surface of a polycrystalline SiC substrate;
   contacting the first amorphous layer with the second amorphous layer; and
   bonding the single crystal Ga$_2$O$_3$-based substrate to the polycrystalline SiC substrate by performing heat treatment of not less than 800° C. on the single crystal Ga$_2$O$_3$-based substrate and the polycrystalline SiC substrate in the state that the first amorphous layer is in contact with the second amorphous layer,
   wherein the single crystal Ga$_2$O$_3$-based substrate comprises a principal plane comprising a (001) plane.

7. The method for producing a semiconductor substrate according to claim 6, wherein a temperature of the heat treatment is not more than 1100° C.

* * * * *